(12) United States Patent
Boyer et al.

(10) Patent No.: US 6,522,546 B1
(45) Date of Patent: Feb. 18, 2003

(54) UNIVERSAL SUPPORT FRAME

(75) Inventors: Thomas R. Boyer, Gambrills, MD (US); Bradley Paul Davidson, Joppa, MD (US); Joseph A. Schmukler, Glenwood, MD (US)

(73) Assignee: Ciena Corporation, Linthicum, MD (US)

( * ) Notice: Subject to any disclaimer, the term of this patent is extended or adjusted under 35 U.S.C. 154(b) by 0 days.

(21) Appl. No.: 09/912,022

(22) Filed: Jul. 24, 2001

(51) Int. Cl.[7] ................................................. H05K 7/20
(52) U.S. Cl. .................... 361/720; 211/41.17; 361/600; 361/679; 361/610; 361/695; 361/799; 361/825; 364/831; 324/158.1; 324/760
(58) Field of Search ...................... 211/41.17; 324/760, 324/537, 758, 158.1; 361/600, 679, 610, 694–695, 752, 797, 799, 825, 829, 831

(56) References Cited

U.S. PATENT DOCUMENTS

| | | | | |
|---|---|---|---|---|
| 3,188,524 A | * | 6/1965 | Williams | 361/413 |
| 3,420,381 A | * | 1/1969 | Bradfield | 361/413 |
| 4,958,261 A | * | 9/1990 | Hueere | 361/417 |
| 5,162,978 A | * | 11/1992 | Vogt et al. | 361/413 |
| 6,166,916 A | * | 12/2000 | Jelinger | 361/756 |

* cited by examiner

*Primary Examiner*—Gregory Thompson
(74) *Attorney, Agent, or Firm*—Michael R. Cammarata

(57) ABSTRACT

A universal support frame that holds a printed (PCB) so that both sides are accessible for processing and testing, and which provides an attachment mechanism for holding a mechanism to cool the PCB as it is being processed or tested. The universal support frame includes a base, and a first board support pivotally connected to the base. A pair of support angles are connected at their first ends to the first board support, and are connected at their second ends to a second board support. A variety of PCBs are capable of being held between the first and second board supports since the second board support is adjustable. Furthermore, both sides of a PCB may be accessed since the first board support may be rotated relative to the base. The second board support connects to a bracket for holding a cooling mechanism, such as a fan, that cools the PCB and prevents it from overheating. The fan speed maybe controlled to match the thermal profile of the PCB being tested, and prevent undercooling and overcooling of the PCB.

24 Claims, 2 Drawing Sheets

UNIVERSAL SUPPORT FRAME

BACKGROUND OF THE INVENTION

A. Field of the Invention

The present invention relates generally to the communications field, and, more particularly to a universal support frame for holding printed circuit boards (PCB) used in the communications field.

B. Description of the Related Art

Printed circuit board (PCB) assemblies are used in computers, communications equipment, televisions, and many other products. In a typical PCB assembly, many electrical components are attached to the top and bottom surfaces of a PCB. Since the electronics manufacturing industry is highly competitive, it is important to maximize the throughput of processing PCB assemblies and to securely attach the electrical components to the PCBs.

The manufacturing of PCB assemblies involves many processes, one of which is surface mounting components to PCBs. In addition to maximizing the throughput of processing PCB assemblies, it is also becoming important to accurately mount a large number of very small components to one side of the PCB assemblies. Furthermore, once the PCB is completed, tests need to be performed upon the PCB to ensure its functionality.

When components are mounted onto a PCB or a PCB is tested, the PCB is typically mounted in a fixture assembly that holds the PCB. Conventional PCB fixture assemblies hold a single PCB in a horizontal plane so that one side of the PCB may be processed or tested. Sometimes, however, both sides of the PCB need to be accessible. With conventional PCB fixture assemblies, this is not possible without removing the PCB from the fixture assembly and turning the PCB over. At other times, a PCB needs to be tested or processed in a vertical plane. Conventional PCB fixture assemblies fail to provide a convenient means for holding a PCB in a vertical plane so that both sides of the PCB are accessible for processing or testing.

When PCBs are being tested, they must be removed from their communications module. Typical communications modules have a mechanism for cooling the PCBs contained therein. Unfortunately, when PCBs are removed from their modules, the heat generated by the PCB increases significantly, and conventional PCB fixture assemblies fail to provide a mechanism to cool the PCB as it is being tested outside the module. The increased heat may damage the PCB, adding significant costs for replacement or repair of the damaged PCB. The heat may also create latent defects in the PCB that do not surface until after the PCB is in operation.

Therefore, there is a significant need in the art to quickly and consistently support PCB assemblies with different configurations of components in the manufacturing and testing of PCB assemblies. There is also a need in the art for a PCB fixture assembly that holds a PCB in a vertical plane so that both sides of the PCB are accessible for processing or testing, and which provides a mechanism to cool the PCB as it is being processed or tested.

SUMMARY OF THE INVENTION

The present invention solves the problems of the related art by providing a universal support frame that holds a PCB in a plane so that both sides are accessible for processing and testing, and which provides an attachment mechanism for holding a means to cool the PCB as it is being processed or tested.

In accordance with the purpose of the invention, as embodied and broadly described herein, the invention comprises a universal support frame for holding a printed circuit board, having: a first board support pivotally connected to a base; a pair of support angles, each of said support angles being connected at a first end to said first board support; and a second board support connected to second ends of said support angles, wherein the printed circuit board is capable of being held between said first and second board supports.

Further in accordance with the purpose of the invention, as embodied and broadly described herein, the invention comprises a method of using a universal support frame having a first board support pivotally connected to a base, a pair of support angles, each of the support angles being connected at a first end to the first board support; a second board support connected to second ends of the support angles, comprising: retaining a first portion of a printed circuit board in the first board support; and retaining a second portion of the printed circuit board in the second board support.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF THE DRAWINGS

The present invention will become more filly understood from the detailed description given hereinbelow and the accompanying drawings which are given by way of illustration only, and thus are not limitative of the present invention, and wherein.

DETAILED DESCRIPTION OF THE PREFERRED EMBODIMENTS

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

Figure 1:
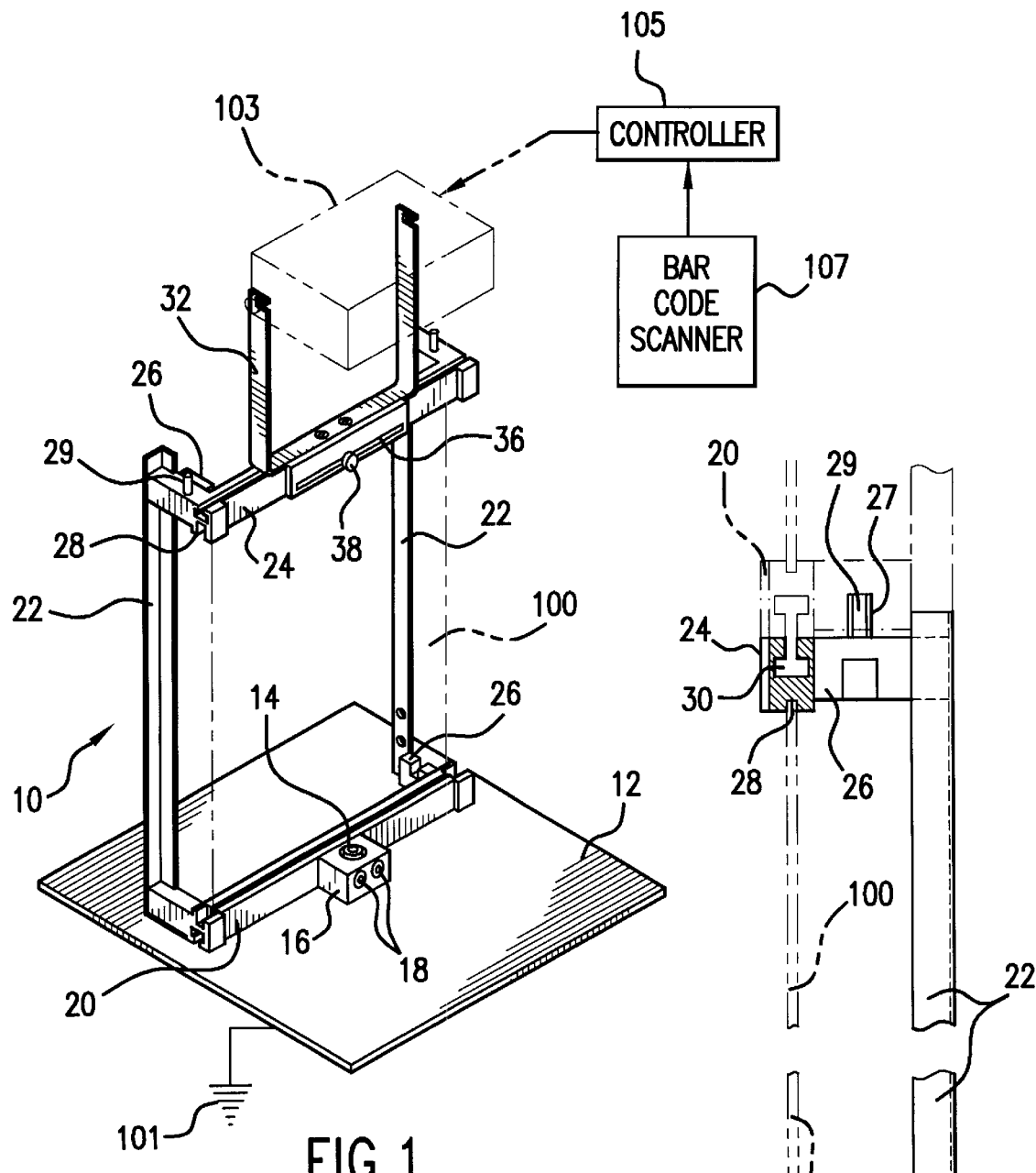
FIG. 1 is a perspective view of a universal support frame in accordance with an embodiment of the present invention.

Referring now specifically to the drawings, an embodiment of the universal support frame of the present invention is illustrated in FIGS. 1–5, and shown generally as reference numeral 10. As shown in FIG. 1, universal support frame 10 includes a base plate 12 having a pivot 14 connected thereto that rotatably supports a rotating mount block 16. A pair of connecting means, such as cap screws 18, extend through and connect mount block 16 to a lower U-shaped printed circuit board (PCB) support 20. A pair of support angles 22 connect at one end to and are supported by lower U-shaped PCB support 20, via conventional connecting means, such as screws, nuts and bolts, etc. An upper U-shaped PCB support 24 connects to and supports the other ends of support angles 22, via conventional connecting means, such as screws, nuts and bolts, etc.

Figure 5:
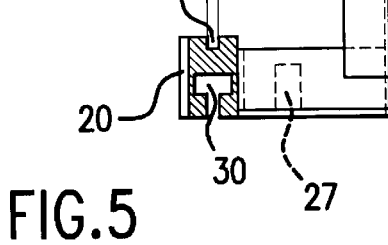
FIG. 5 is a cross-sectional view in elevation of stacked universal support frames shown in FIGS. 1–4, taken along line 5—5 of FIG. 2.

Lower and upper U-shaped PCB supports 20, 24 may be identical, so that they may be interchangeable. As shown in FIG. 5, the base portion of each U-shaped PCB support 20,24 has a PCB slot 28 and T-slot 30, opposing PCB slot 28, formed therein. PCB slot 28 of lower U-shaped PCB support 20 faces PCB slot 28 of upper U-shaped PCB support 24, so that a printed circuit board (PCB) 100 may be inserted and retained within PCB slots 28.

PCB 100 maybe further secured in PCB slots 28 with additional connection mechanisms. For example, pins may be provided at either end of each PCB slot 28, and the ejector clips of PCB 100 may clip around these pins. This keeps PCB 100 and universal support frame 10 as one entity, and prevents PCB 100 from sliding during internal transfer or quick movements on a bench.

Figure 3:
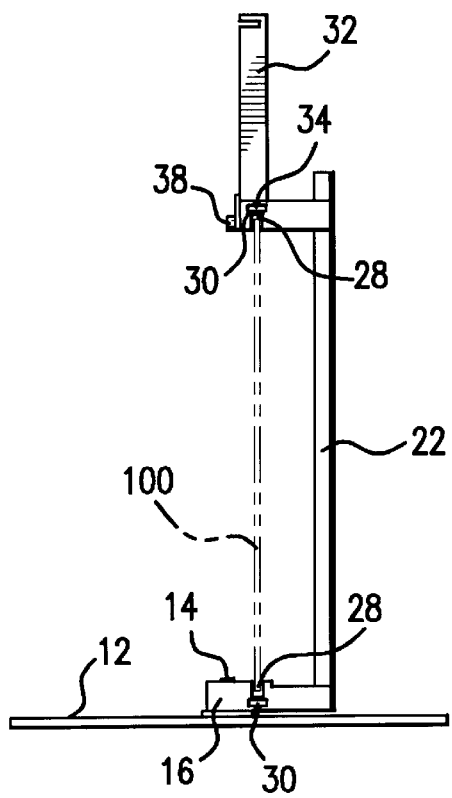
FIG. 3 is a right side elevational view of the universal support frame shown in FIGS. 1 and 2.

As shown in FIGS. 1 and 3, T-slot 30 of upper U-shaped PCB support 24 may hold a fan bracket 32 by slidably receiving a T-slide 34 of fan bracket 32. Fan bracket 32 may also be U-shaped and have leg portions that receive and support a cooling mechanism, such as, for example, a conventional fan 103. Fan 103 may be a conventional fan or an ionizing fan having an ion generator located next to a conventional fan. An ionizing fan would help reduce electrostatic discharge (ESD) buildup on PCB 100. In addition to providing fan 103 above PCB 100, a fan 103 may also be provided to the left and right of PCB 100, as well as below PCB 100 (if frame 10 is in a horizontal position as discussed below). The thermal mapping of PCB 100 would dictate the required fan layout.

Figure 2:
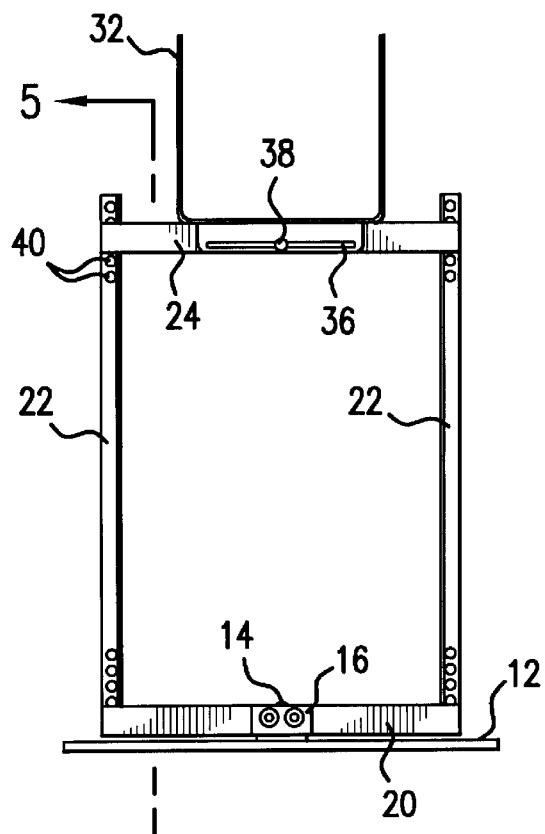
FIG. 2 is a front elevational view of the universal support frame shown in FIG. 1.

As shown in FIG. 2, the base portion of fan bracket 32 includes a horizontal slot 36 that receives a thumb screw 38. Fan bracket 32, and thus the position of fan 103, may be horizontally adjusted by loosening thumb screw 38 and moving fan bracket 32 along horizontal slot 36. Once the desired location of fan 103 is found, thumb screw 38 may then be tightened to prevent fan bracket 32 from moving horizontally.

Fan 103 provides a positive airflow to prevent PCB 100 from overheating. Since different PCBs have different thermal profiles, it is preferable to control the speed of fan 102 to match the thermal profile of the PCB being tested. Accordingly, fan 102 may be controlled by control signals provided by a conventional controller 105, such as a programmable logic controller (PLC), a general purpose personal computer programmed with control software, etc. Control software similar to the software disclosed in U.S. Pat. No. 6,188,402, assigned to the assignee of the present application, CIENA Corporation, may be utilized, the disclosure of which is herein incorporated by reference. The type of PCB 100 being tested maybe entered into the conventional controller 105, via, for example, a bar code scanner 107, and the controller 105 will set the speed of fan 102 to match the thermal profile of the PCB 100 being tested, and thus prevent undercooling and overcooling of the PCB 100.

As best shown in FIG. 1, a faceplate adaptor 26 may be connected to one or both leg portions of each of the lower U-shaped PCB support 20 and the upper U-shaped PCB support 24. Faceplate adaptors 26 may also be U-shaped so that they may receive a portion of a faceplate protecting the PCB. Typically, PCBs are situated behind an outer faceplate of the communications equipment or module in order to protect the PCBs from ESD. Once ESD protection is added to the universal support frame 10 and PCB 100 combination via, for example, ESD shielding bags, the combination may provide a safe means for transporting PCB 100 outside of an ESD-safe environment. While within an ESD-safe environment, the universal support frame 10 provides ESD protection via a grounding connection 101 connected to base plate 12, as shown in FIG. 1. The bench may also provide grounding if universal support frame 10 is made from a conductive metal material.

Along with the ability to provide a cooling mechanism, universal support frame 10 also holds PCB 100 in a vertical plane, is rotatable so that both sides of PCB 100 may be accessed, and is vertically adjustable so that a variety of PCBs may be held vertically within frame 10. The vertical adjustment of universal support frame 10 may be provided by a means for holding upper U-shaped support 24 at varying heights along support angles 22. As shown in FIG. 2, and by way of example only, this is accomplished by providing a number of holes 40 at different heights in support angles 22 and connecting upper U-shaped PCB support 24 to support angles 22, via holes 40 and conventional connecting means, such as screws, nuts and bolts, etc.

Figure 4:
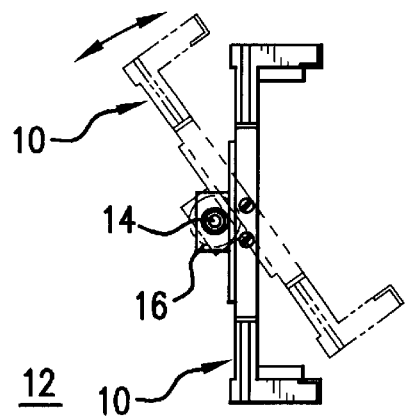
FIG. 4 is a top plan view of the universal support frame shown in FIGS. 1–3.

As best shown in FIG. 4, universal support frame 10 rotates due to mount block 16 rotating on pivot 14. Universal support frame 10 is shown rotated in phantom outline as reference numeral 10', and may be rotated clockwise or counterclockwise.

A stop or stops may be provided on base plate 12 to prevent universal support frame 10 from rotating while PCB 100 is being tested or processed. Such stops could be removably provided on base plate 12, and once the desired rotation of universal support frame 10 is achieved, stops may be set in place to prevent rotation. Alternatively, a locking mechanism maybe provided on rotating mount block 16 to lock mount block 16 to pivot 14 once the desired rotation of frame 10 is achieved. Mount block 16 may also frictionally rotate on pivot 14 so that PCB 100 will not rotate when being tested or processed, but maybe rotated when an operator applies sufficient force to universal support frame 10.

The universal support frame 10 of the present invention may be made from a variety of materials. Preferable, the components of universal support frame 10 are made from a conductive metal having a conductive protective coating provided thereon. For example, aluminum having a black anodized surface may be used. A conductive Dehrin® (registered trademark of E.I. du Pont de e Nemours and Company for its brand of acetal resin) is also a possible. Such materials prevent charge accumulation on PCB 100.

Universal support frame 10 may also be a variety of dimensions, although the width of frame 10 should preferably accommodate all PCB widths. Thus frame 10 should be wide enough to hold the largest PCB available.

If needed, PCB 100 may be stored in universal support frame 10 for later retrieval. Upper U-shaped support 24 may also have pins 29 in the top corners, and associated holes 27 in the bottom corners of lower U-shaped support 20, as shown in FIGS. 1 and 5. This would allow one frame 10 to be stacked upon another frame 10, as shown in FIG. 5.

The universal support frame 10 of the present invention provides several advantages. It protects PCB 100 at all times during testing and storage, preventing damage, rework, or field failure of PCB 100. It may hold PCB 100 vertically or horizontally, with or without cooling attached. To hold PCB 100 horizontally, lower U-shaper support 20 needs to be detached from mount block 16, and frame 10 would be horizontally laid on base plate 12. Cooling, via fan 103, is available on both sides of PCB 100 in the horizontal position, while cooling is available on one side of PCB 100 in the vertical position.

The universal support frame 10 is also mobile from bench to bench or building to building, and always protects PCB 100 during movement. Because frame 10 locks PCB 100 in place, PCB 100 does not need special packaging during transport. Finally, universal support frame 10 may be used to assemble parts to or test parts on the PCB 100, since frame 10 helps prevent PCB 100 from flexing and damaging already installed components on PCB 100.

It will be apparent to those skilled in the art that various modifications and variations can be made in the universal support frame of the present invention and in construction of the universal support frame without departing from the scope or spirit of the invention. The physical dimensions and material selections, are purely exemplary and not limiting of the embodiments of the present invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A universal support frame for holding a printed circuit board, comprising:
    a first board support pivotally connected to a base;
    a pair of support angles, each of said support angles being connected at a first end to said first board support; and
    a second board support connected to second ends of said support angles,
    wherein the printed circuit board is capable of being held between said first and second board supports,
    wherein each of said first and second board supports has a slot therein for receiving a portion of the printed circuit board.

2. A universal support frame as recited in claim 1, further comprising mechanism for holding a cooling mechanism, said cooling mechanism holding mechanism being connected to said second board support.

3. A universal support frame as recited in claim 1, further comprising at least one faceplate adaptor provided on one of said first board support, said second board support, or both first and second board supports, said at least one faceplate adaptor receiving a portion of a corresponding faceplate of the printed circuit board.

4. A universal support frame as recited in claim 1, wherein said first board support pivotally connects to the bas e via a mount block pivotally connected to a pivot connected to the base.

5. A universal support frame as recited in claim 2, wherein said cooling mechanism holding mechanism comprises a horizontally adjustable bracket.

6. A universal support frame as recited in claim 2, wherein the cooling mechanism comprises one of a fan or an ionizing fan.

7. A universal support frame as recited in claim 5, wherein said horizontally adjustable bracket has a slide that slidably mates with a slot provided in said second board support.

8. A universal support frame as recited in claim 1, wherein the universal support frame is electrically grounded.

9. A universal support frame as recited in claim 1, wherein the printed circuit board is capable of being held vertically or horizontally between said first and second board supports.

10. A universal support frame for holding a printed circuit board, comprising:
    a first board support pivotally connected to a base;
    a pair of support angles, each of said support angles being connected at a first end to said first board support; and
    a second board support connected to second ends of said support angles, wherein the printed circuit board is capable of being held between said first and second board supports,
    wherein said second board support is adjustable on said support angles towards and away from said first board support.

11. A universal support frame as recited in claim 10, wherein each of said first and second board supports has a slot therein for receiving a portion of the printed circuit board.

12. A universal support frame as recited in claim 10, wherein said second board support includes at least one pin, and said first board support has an opening provided therein for receiving the at least one pin of said second board support so that said first board support may be stacked upon the second board support.

13. A universal support frame as recited in claim 10, wherein the printed circuit board is capable of being held vertically or horizontally between said first and second board supports.

14. A universal support frame as recited in claim 10, further comprising mechanism for holding a cooling mechanism, said cooling mechanism holding mechanism being connected to said second board support.

15. A universal support frame for holding a printed circuit board, comprising:
    a first board support pivotally connected to a base;
    a pair of support angles, each of said support angles being connected at a first end to said first board support; and
    a second board support connected to second ends of said support angles, wherein the printed circuit board is capable of being held between said first and second board supports,
    wherein said first board support rotates clockwise and counterclockwise in relation to said base.

16. A universal support frame for holding a printed circuit board, comprising:
    a first board support pivotally connected to a base;
    a pair of support angles, each of said support angles being connected at a first end to said first board support; and
    a second board support connected to second ends of said support angles, wherein the printed circuit board is capable of being held between said first and second board supports,
    wherein said second board support includes at least one pin, and said first board support has an opening provided therein for receiving the at least one pin of said second board support so that said first board support may be stacked upon the second board support.

17. A universal support frame as recited in claim 16, wherein each of said first and second board supports has a slot therein for receiving a portion of the printed circuit board.

18. A method of using a universal support frame having a first board support pivotally connected to a base, a pair of support angles, each of the support angles being connected at a first end to the first board support; a second board support connected to second ends of the support angles, comprising:

retaining a first portion of a printed circuit board in the first board support;

retaining a second portion of the printed circuit board in the second board support;

providing a cooling mechanism to cool the printed circuit board; and controlling the cooling mechanism to match the thermal profile of the printed circuit board.

19. A method of using a universal support frame as recited in claim 18, further comprising:

rotating the first board support so that both sides of the printed circuit board may be accessed.

20. A method of using a universal support frame as recited in claim 15, further comprising:

providing one of a fan or an ionizing fan to cool the printed circuit board.

21. A method of using a universal support frame as recited in claim 20, further comprising:

controlling the speed of the fan or ionizing fan to match the thermal profile of the printed circuit board.

22. A method of using a universal support frame as recited in claim 18, wherein the printed circuit board is held vertically or horizontally between the first and second board supports.

23. A method of using a universal support frame having a first board support pivotally connected to a base, a pair of support angles, each of the support angles being connected at a first end to the first board support; a second board support connected to second ends of the support angles, comprising:

retaining a first portion of a printed circuit board in the first board support;

retaining a second portion of the printed circuit board in the second board support; and adjusting the second board support so that the second portion of the printed circuit board may be retained in the second board support.

24. A method of using a universal support frame having a first board support pivotally connected to a base, a pair of support angles, each of the support angles being connected at a first end to the first board support; a second board support connected to second ends of the support angles, comprising:

retaining a first portion of a printed circuit board in the first board support; and retaining a second portion of the printed circuit board in the second board support, wherein the second board support includes at least one pin, and the first board support has an opening provided therein for receiving the at least one pin of the second board support, the method further comprising:

stacking at least one other universal support frame upon the universal support frame by providing the pin of the second board support of the universal support frame within the opening of the first board support of the at least one other universal support frame.

* * * * *